(12) United States Patent
Pesetski et al.

(10) Patent No.: US 9,208,446 B2
(45) Date of Patent: Dec. 8, 2015

(54) METHODS OF INCREASING FIDELITY OF QUANTUM OPERATIONS

(71) Applicants: Aaron A. Pesetski, Gambrills, MD (US); James E. Baumgardner, Ellicott City, MD (US)

(72) Inventors: Aaron A. Pesetski, Gambrills, MD (US); James E. Baumgardner, Ellicott City, MD (US)

( * ) Notice: Subject to any disclaimer, the term of this patent is extended or adjusted under 35 U.S.C. 154(b) by 39 days.

(21) Appl. No.: 14/140,996

(22) Filed: Dec. 26, 2013

(65) Prior Publication Data

US 2015/0186791 A1     Jul. 2, 2015

Related U.S. Application Data

(62) Division of application No. 12/970,504, filed on Dec. 16, 2010, now Pat. No. 8,631,367.

(51) Int. Cl.
| | |
|---|---|
| *H03K 19/195* | (2006.01) |
| *H03K 19/20* | (2006.01) |
| *G06N 99/00* | (2010.01) |
| *B82Y 10/00* | (2011.01) |

(52) U.S. Cl.
CPC .............. *G06N 99/002* (2013.01); *B82Y 10/00* (2013.01); *H03K 19/20* (2013.01)

(58) Field of Classification Search
None
See application file for complete search history.

(56) References Cited

U.S. PATENT DOCUMENTS

| | | |
|---|---|---|
| 7,219,018 B2 | 5/2007 | Vitaliano et al. |
| 7,230,266 B2 | 6/2007 | Hilton et al. |
| 7,451,292 B2 | 11/2008 | Routt |
| 7,498,832 B2 | 3/2009 | Baumgardner et al. |
| 7,518,120 B2 | 4/2009 | Monroe et al. |
| 7,613,765 B1 | 11/2009 | Hilton et al. |
| 7,893,708 B2 | 2/2011 | Baumgardner et al. |
| 8,111,083 B1 | 2/2012 | Pesetski et al. |
| 8,350,587 B2 | 1/2013 | Zubairy et al. |
| 2004/0109631 A1* | 6/2004 | Franson et al. ............... 385/15 |
| 2008/0131047 A1 | 6/2008 | Beausoleil et al. |
| 2010/0182039 A1 | 7/2010 | Baumgardner et al. |

FOREIGN PATENT DOCUMENTS

| | | |
|---|---|---|
| WO | WO 2004/012139 A2 | 2/2004 |
| WO | WO 2009/149086 A2 | 12/2009 |
| WO | WO 2009/152180 A2 | 12/2009 |
| WO | WO 2010/028183 A2 | 3/2010 |

* cited by examiner

*Primary Examiner* — Jany Richardson
(74) *Attorney, Agent, or Firm* — Tarolli, Sundheim, Covell & Tummino LLP

(57) ABSTRACT

Systems and methods are provided for improving fidelity of a quantum operation on a quantum bit of interest. A controlled quantum gate operation, controlled by the quantum bit of interest, id performed on an ancillary quantum bit. An energy state of the ancillary quantum bit is measured to facilitate the improvement of the fidelity of the quantum operation.

6 Claims, 6 Drawing Sheets

METHODS OF INCREASING FIDELITY OF QUANTUM OPERATIONS

RELATED APPLICATIONS

The present invention is a divisional application of U.S. Ser. No. 12/970,504, filed on 16 Dec. 2010, and is herein incorporated by reference in its entirety.

FIELD OF THE INVENTION

The invention relates generally to quantum computers. More specifically, the invention relates to generating fundamental logical operations in quantum computers.

BACKGROUND OF THE INVENTION

A classical computer operates by processing binary bits of information that change state according to the laws of classical physics. These information bits can be modified by using simple logic gates such as AND and OR gates. The binary bits are physically created by a high or a low energy level occurring at the output of the logic gate to represent either a logical one (e.g. high voltage) or a logical zero (e.g. low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability means that a quantum computer can solve a large class of problems with exponentially greater efficiency than that of a classical computer.

SUMMARY OF THE INVENTION

In accordance with an aspect of the present invention, a method is provided for improving fidelity of a quantum operation on a quantum bit of interest. A controlled quantum gate operation, controlled by the quantum bit of interest, is performed on an ancillary quantum bit. An energy state of the ancillary quantum bit is measured to facilitate the improvement of the fidelity of the quantum operation.

In accordance with another aspect of the present invention, a method is provided for improving fidelity of a quantum gate operation. A first quantum gate operation is performed on a first ancillary quantum bit. A second quantum gate operation is performed on the first ancillary quantum bit and a second ancillary quantum bit. An energy state of the second ancillary quantum bit is measured to determine an energy state of the first ancillary quantum bit.

In accordance with still another aspect of the present invention, a method is provided for improving fidelity of a quantum measurement operation. A controlled NOT (CNOT) gate operation, controlled by a quantum bit of interest, is performed on an ancillary quantum bit. An energy state of the ancillary quantum bit is measured to determine an energy state of the quantum bit of interest.

In accordance with yet another aspect of the present invention, a method is provided for improving fidelity of a quantum operation on a quantum bit of interest. A controlled quantum gate operation, controlled by the quantum bit of interest, is performed on an ancillary quantum bit to produce an entangled state of the system formed by quantum bit of interest and the ancillary quantum bit. The entangled state included a superposition of a plurality of basis states. An energy state of the ancillary quantum bit is measured to eliminate at least one basis state from the entangled state.

BRIEF DESCRIPTION OF THE DRAWINGS

The features, objects, and advantages of the invention will become more apparent from the detailed description set forth below when taken in conjunction with the drawings, wherein.

DETAILED DESCRIPTION OF THE INVENTION

Figure 1:
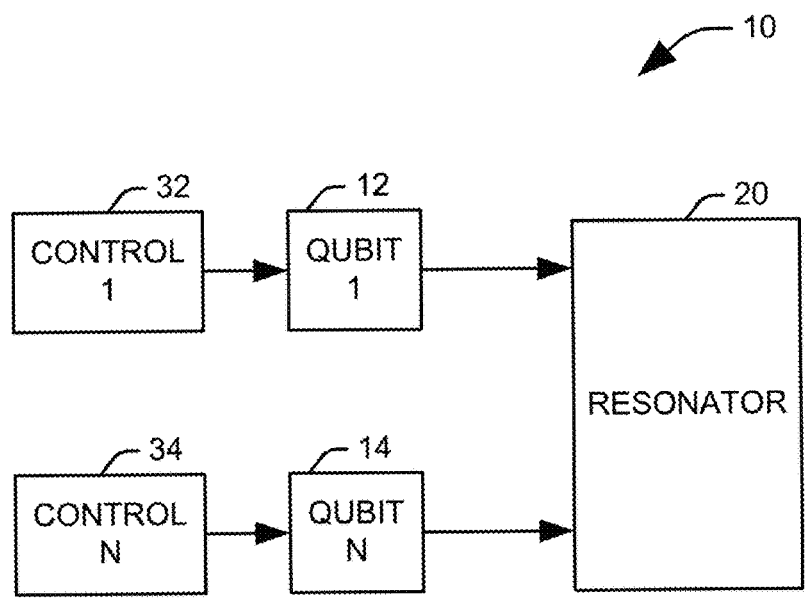
FIG. 1 illustrates a basic block diagram of a quantum circuit configured to perform a quantum gate in accordance with an aspect of the present invention.
Figure 2:
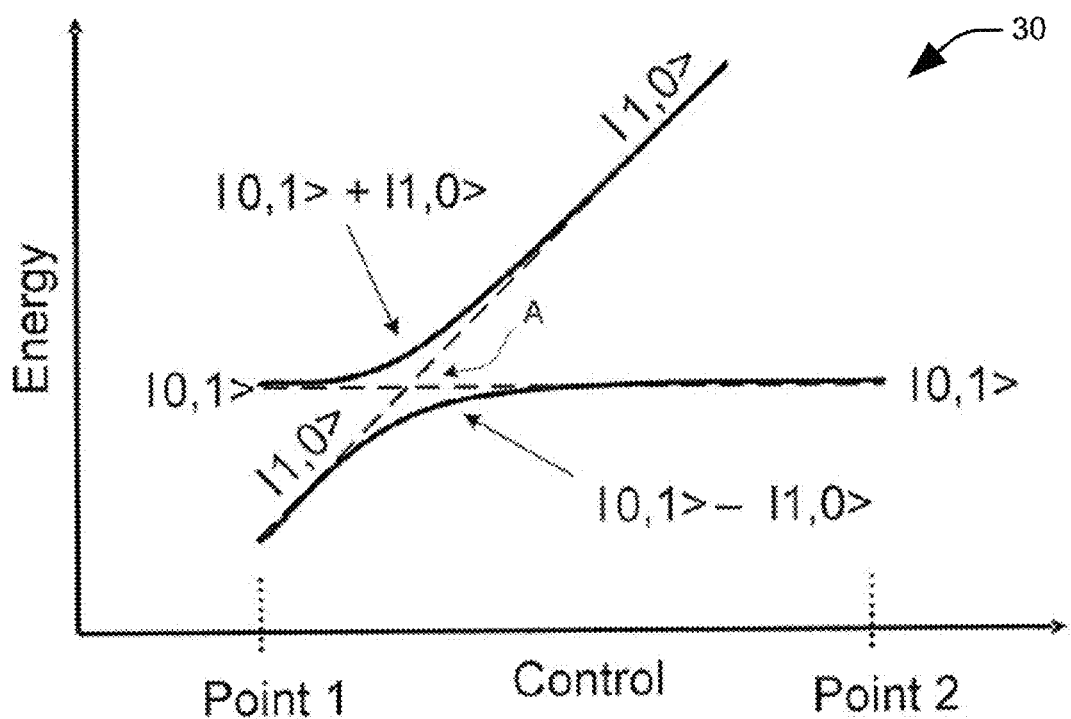
FIG. 2 is an energy diagram illustrating energy states in a qubit-resonator system having some degree of coupling between the qubit and the resonator.
Figure 3:
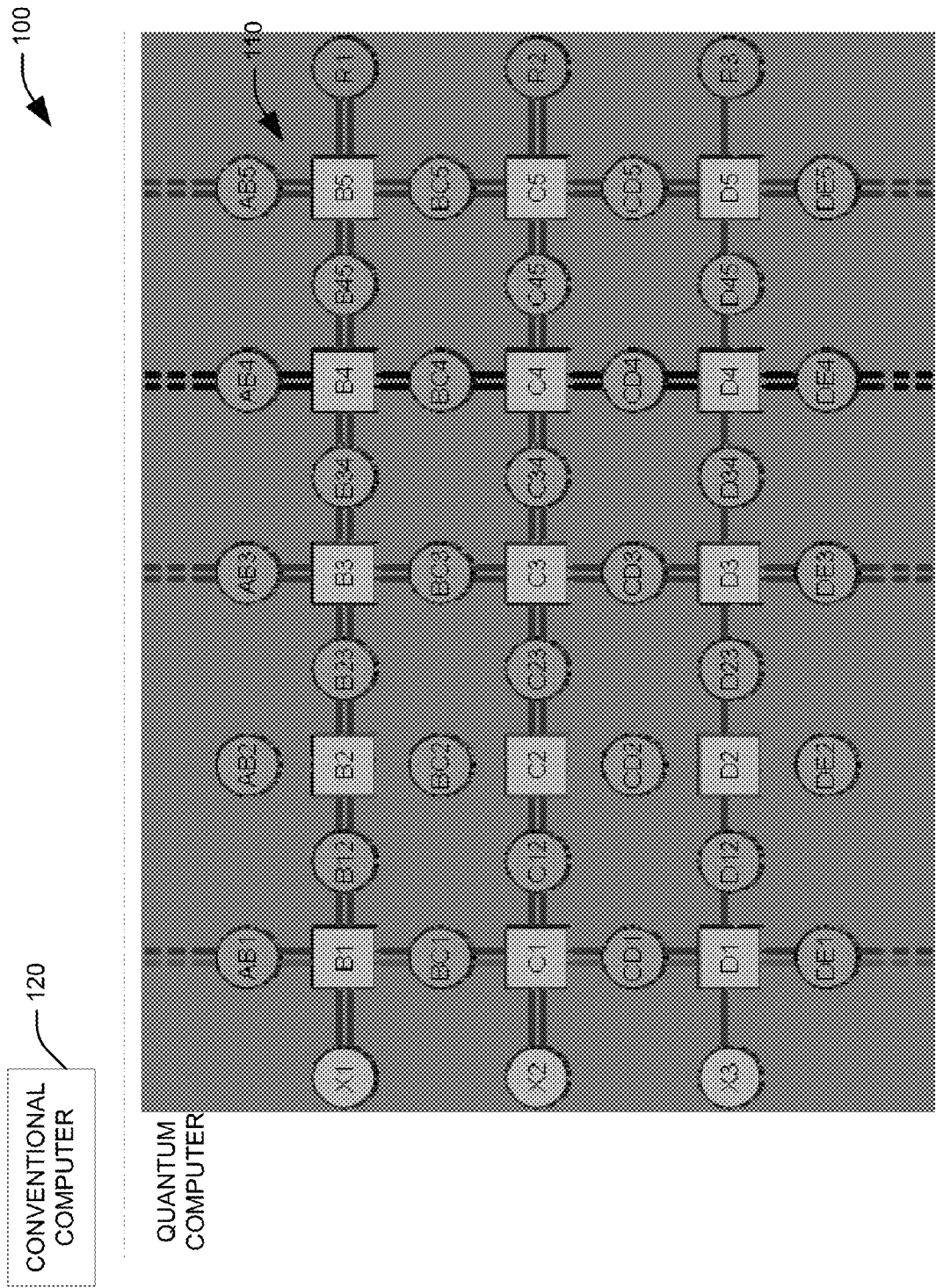
FIG. 3 illustrates an exemplary system that could be used to perform methodologies in accordance with an aspect of the present invention.

Digital quantum gates are a technique for performing qubit gating operations with arbitrarily high fidelity. FIGS. 1-3 provide an exemplary architecture for performing the various gating operations of FIG. 4-10, but it will be appreciated that the methods of increasing fidelity in readout measurements and X gates can be employed to a variety of different quantum gate technologies and architectures.

To establish some terminology, the term "sweep" is intended to refer to an adiabatic sweeps of a qubit control parameter, in which the control parameter is adjusted slowly relative to an energy of a splitting between energy states of a system. In a sweep, the qubit state tracks the energy contour of the system as the control parameter is adjusted. The fidelity of a sweep can be made arbitrarily high by lowering the sweep rate. A "jump" takes advantage of symmetries of the qubit Hamiltonian to instantaneously change the energy of the system without changing the state. In a jump, the control parameter is rapidly swept from one point to another in which the qubit has the same energy eigenstate but may or may not have the same eigenvalue. The fidelity of a jump can be made arbitrarily high by increasing the sweep rate.

FIG. 1 illustrates a basic block diagram of a quantum circuit 10 configured to perform a quantum gate 10 in accordance with an aspect of the present invention. The quantum circuit 10 includes a plurality of qubits 12 and 14, each coupled to a fixed resonator 20. In the illustrated implementation, two qubits 12 and 14 are used, but it will be appreciated that quantum logic gates can be implemented with one, two, or more than two qubits coupled to a given resonator. One of a plurality of classical digital controls 32 and 34 are coupled to the each of the plurality of qubits 12 and 14. The coupling between each qubits (e.g., 12) and its corresponding classical control (e.g., 32) is arranged so that the quantum state of qubit 12 may be changed in response to adjustment of a classical control parameter associated with the digital control. The term "classical" implies that the manner of control behaves generally according to the laws of classical physics. The quantum circuit of FIG. 1 has general application in quantum computing, and may be implemented using any quantum circuit technology in which the energy splitting is tunable.

For example, a physical implementation of any of the plurality of qubits 12 and 14 may be a Josephson junction, a quantum dot, a SQUID (superconducting quantum interference device), a Cooper pair box, or an ion trap. The implementation of the resonator 20 is likewise not restricted to a particular technology. A resonator 20 that may be employed in accordance with the basic principles of the invention may be any system having at least two quantum states. Examples of a resonator that satisfy this requirement include, but are not limited to, a transmission line, a resonant cavity, and another qubit. In addition, the coupling of a qubit to a resonator may be accomplished according to the invention using any of various means of physical coupling. For example, the qubit-resonator coupling may be a mechanical coupling by means of an electrical conductor. Alternatively, the qubit-resonator coupling may include, without limitation, capacitive, inductive, magnetic, nuclear, and optical coupling, or any combination of the foregoing.

FIG. 2 is an energy diagram 30 illustrating energy states in a qubit-resonator system having some degree of coupling between the qubit and the resonator. Of particular importance is the behavior of qubit and resonator energy states as the qubit is tuned to a level that would correspond to a crossing point, labeled A in the diagram. For example, for an initial state having a qubit in an excited state and the resonator in a ground state, denoted as |1,0>, as the classical control parameter is swept slowly from Point 1 to a point corresponding to crossing A, the effect of the coupling dominates, and the crossing at point A is avoided. This results from a quantum mechanical effect whereby two systems that are coupled together and that have the same energy will not cross energy lines. Thus, as the classical control parameter sweeps to Point 2, the state of the system tracks the energy line labeled |0,1>− |1,0>. This energy line asymptotically approaches the energy line |0,1> of the uncoupled case, which is depicted in FIG. 2 as a dashed line. At point 2, the system assumes the state |0,1>, with the qubit in the ground state and the resonator in the excited state. Provided that the sweep of the classical control parameter is adiabatic, the end result is a change of state from |1,0> to |0,1>, whereby a photon has been taken from the qubit and transferred to the resonator. In essence, the information has been swapped.

Similarly, as shown in FIG. 2, with the system in an initial state of |0,1> at Point 1, an adiabatic sweep of the classical control parameter toward Point 2 will track the energy line labeled |0,1>+|1,0>. Again, the crossing at A is avoided, and the energy line asymptotically approaches energy line |1,0> of the uncoupled case, depicted in FIG. 2 as a dashed line. At Point 2, the system achieves the state |1,0>, effectively swapping information between qubit and resonator.

In the illustrated diagram, the exchange of information between qubit and resonator occurs when there is an adiabatic sweep of the classical control parameter. This means that the parameter is adjusted very slowly relative to all other relevant time scales. For example, the relevant time scales may be determined according to the coupling strength or according to the size of the energy splitting. In other words, an adiabatic sweep is one that is sufficiently slow to allow the state of the system to follow the energy line in which it started, without allowing it to cross another energy line.

FIG. 3 illustrates an exemplary system that could be used to perform methodologies in accordance with an aspect of the present invention. The system 100 includes a quantum processor 110 comprising a plurality of resonators B1-B5, C1-C5, and D1-D5, each configured to store all or a portion of the quantum information comprising a qubit. Each of the plurality of resonators can be configured as transmission line resonators, lumped element resonators, distributed resonators, or a combination thereof. Each of the plurality of resonators can have an associated characteristic frequency, with a first set B1, B3, B5, C2, C4, D1, D3, and D5 of the plurality of resonators having a first associated frequency (e.g., 10 GHz) and a second set B2, B4, C1, C3, C5, D2, and D4 of the plurality of resonators can having a second associated frequency (e.g., 15 GHz).

The quantum processor 110 further comprises a plurality of qubit cells AB1-AB5, BC1-BC5, CD1-CD5, DE1-DES, B12-D12, B23-D23, B34-D34, B45-D45, X1-X3, and R1-R3 configured to perform logical operations on the stored quantum information. In the illustrated implementation, each of the qubit cells can be implemented as one or more of a Josephson junction, a quantum dot, a SQUID (superconducting quantum interference device), a Cooper pair box, or an ion trap. Each qubit cell can be coupled to one or more resonators, such that the resonators and the qubit cells, taken collectively, can be used to perform logical operations on a qubit.

In normal operation, all of the qubits are kept in their ground state and quantum information in stored in some fraction of the resonators. Quantum information can be routed from one resonator to another by picking any route through empty resonators to perform digital quantum gate operations. For example, if quantum information were stored only in the resonators of the second and fourth column, quantum information could be routed from B2 to D4 by sweeping qubit B23 to transfer the state from B2 to B3. Next, sweep BC3 to transfer to C3, sweep CD3 to transfer to D3, and finally, sweep D34 to transfer to D4. It is possible to transfer quantum information through a resonator even if it already contains another piece of quantum information. Multiple qubit digital quantum gates can be performed by transferring quantum information into two qubits connected to the same resonator and using the sequences of sweeps and jumps as described in U.S. Pat. No. 7,498,832 and an application titled "Quantum Processor Assembly," docket number NG(ES) 019643.

The plurality of qubit cells can include multiple types of qubit cells, each having a different structure and optimized for a different function. For example, a first set of qubit cells X1-X3 can be optimized for performing a quantum rotation, such as a Hadamard gate or an X gate operation, on a coupled resonator (e.g., B1-D1). To this end, each of the first set of qubit cells is configured to have a set of energy states that can be modeled as the state of a spin-1/2 particle, with associated "spin-up" and "spin-down" states that interact differently with an associated classical control parameter. In one implementation, the first set of qubit cells can be constructed as a superconducting flux qubit.

The second set R1-R3 of qubit cells can be configured to be read to determine the state of one or more qubits stored in the quantum processor 110. For example, the second set of qubit cells can include appropriate support equipment for allowing a high fidelity read operation from the qubit cells. It will be appreciated, however, that various systems and methods in accordance with an aspect of the present invention can be used to compensate for a low fidelity read operation, and thus alternative implementations of the second set of qubits are possible. The third set AB1-AB5, BC1-BC5, CD1-CD5, DE1-DES, B12-D12, B23-D23, B34-D34, B45-D45 of qubit cells can be optimized for use in multiple qubit logical gate operations. To this end, each of the third set of qubit cells can be implemented, for example, as a single Josephson junction. In one implementation, the third set can each be implemented as a superconducting phase qubit.

In accordance with an aspect of the present invention, the processor can further comprising a conventional computer system 120 that is configured to tune each of the plurality of qubit cells along their respective frequency ranges and monitor the location of quantum information within the processor. The conventional computer system 120 is configured to provide respective control signals to a plurality of classical control mechanisms (not shown) associated with the plurality of qubit cells as to adjust their associated frequencies and corresponding energy states. In addition, the system control 120 tracks the stored location of quantum information within the processor 110, allowing information to be quickly retrieved when it is needed for a logical gate. For example, information stored in one set of resonators can be moved to resonators near one or more specialized qubit cells to allow a specific logical operation to be performed. In one implementation, any information in the processor 110 will be stored in one or more resonators, as the resonators generally have coherence time superior to that of qubit cells, and the remaining qubit cells and resonators are left in their ground states to avoid any interference with the transfer of the stored data.

Figure 4:
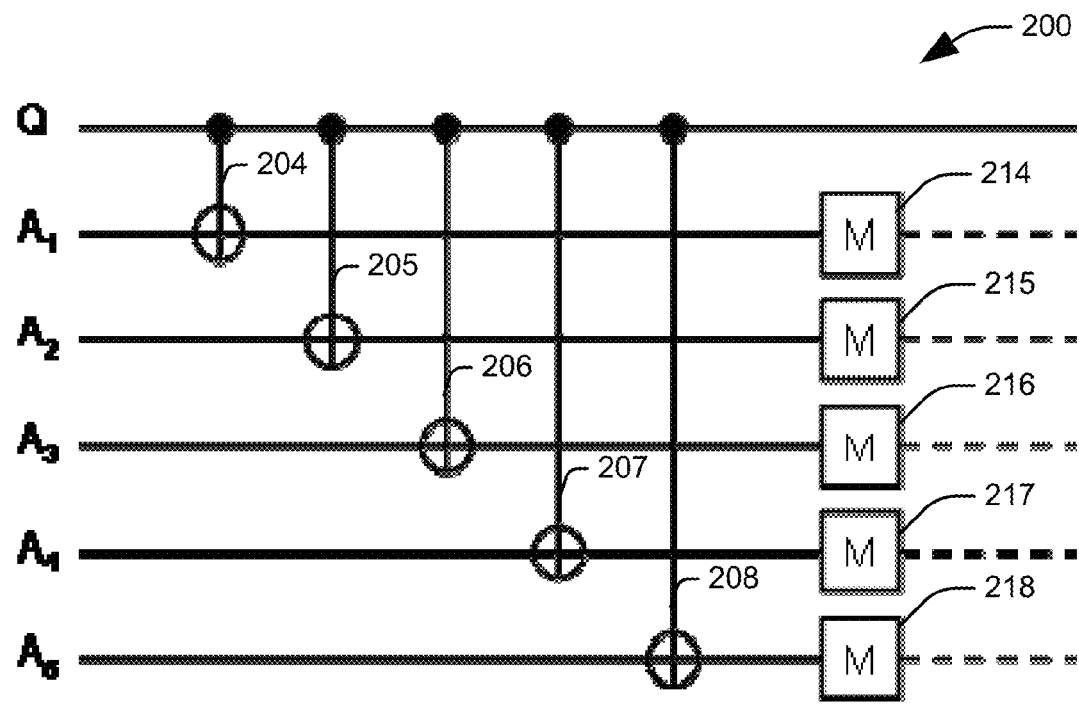
FIG. 4 illustrates one implementation of a schematic quantum gate diagram that employs a high fidelity gate operation to improve a low fidelity measurement in accordance with an aspect of the invention.

FIG. 4 illustrates one implementation of a schematic quantum gate diagram 200 that employs a high fidelity gate operation to improve a low fidelity measurement in accordance with an aspect of the invention. In the schematic quantum gate diagram, a quantum bit of interest, Q, which is the qubit to be measured, is used as a control qubit in a plurality of high fidelity gate operations 204-208 on a corresponding set of at least one ancillary qubit. In the illustrated implementation, the high fidelity gate operation is a controlled NOT (CNOT) operation. It will be appreciated, however, that another appropriate controlled gate operation could be used, such as a Fredkin gate or a Toffoli gate. For these gates, it will be appreciated that the controlled gate operation bit is also performed on a second ancillary qubit. The result of these operations is an entanglement of the quantum bit of interest with the at least one ancillary qubit, $A_1 \ldots A_5$. In the illustrated implementation, five ancillary qubits are used, with each qubit initialized to the ground state, such that the quantum gate operations 204-208 on the ancillary qubits create an entangled state from an original, arbitrary state of the qubit $\alpha|0\rangle+\beta|1\rangle$, such that:

$$\alpha|0\rangle+\beta|1\rangle \to \alpha|000000\rangle+\beta|111111\rangle \qquad \text{Eq. 1}$$

Once the entangled state has been created, each of the five ancilla qubits is measured using a corresponding low fidelity measurement 214-218. When the first low fidelity measurement 214 is performed on the first ancilla qubit, it will project the remaining qubits into either the $|00000\rangle$ state (with probability $|\alpha|^2$) or the $|11111\rangle$ state (with probability $|\beta|^2$). All subsequent measurements should thus yield the same result. However, since the measurement is low fidelity, it will be appreciated that, due to various errors, some measurements may report the wrong result.

In accordance with an aspect of the present invention, a measurement 214-218 can be performed on each of the ancillary qubits and a majority vote can be performed on to determine the correct result. Accordingly, if each measurement has a fidelity, m, the error rate is (1−m), and the error rate, R, of the majority vote can be expressed as:

$$R = \sum_{i=\frac{n+1}{2}}^{n} \binom{n}{i} (1-m)^i m^{n-i} \qquad \text{Eq. 2}$$

By accepting the majority result from the plurality of measurements 214-218, it is possibility to provide an increasingly small error rate, down to an error rate of the high fidelity gate operation, by increasing the number of ancillary qubits. For example, if each measurement has only 96% fidelity, there is a 4% chance that any given measurement will give a wrong answer. By using a majority-voting scheme with five ancillary qubits, the probability of an incorrect measurement of the qubit, Q, is less than 0.1%.

In the implementation illustrated in FIG. 4, all of the ancillary qubits are initialized, and then all of the high-fidelity gate operations are performed, and finally all of the ancillary qubits are measured. This allows all of the ancillary qubits to be prepared in advance and all measurements to be performed simultaneously, reducing the total time necessary for the measurement. Alternatively, the methodology can be implemented by initializing an ancillary qubit, performing the high fidelity gate operation, and measuring the ancillary qubit. This sequence is then repeated four times. This implementation has the advantage that it only requires one ancillary qubit which is used repeatedly. The result is that there exists a trade-off between time and number of qubits required.

The discussion above assumed not only a high fidelity CNOT gate but also high fidelity state initialization. However, the methodology of FIG. 4 could also be used to improve poor state initialization if a high fidelity measurement is available. For example, suppose that the state initialization process which is supposed to set the state to $|0\rangle$ includes some small error, such that the state is set to $|0\rangle+\epsilon|1\rangle$, ignoring state normalization for the sake of simplicity. When the high fidelity gates in FIG. 4 are performed, the qubit and ancillary qubits become entangled. The resulting state contains $2^6$ terms of the form $\epsilon^n|qa_1 \ldots a_5\rangle$, where $n=a_1+a_2+\ldots+a_3$. It will be appreciated that the initialization technique need not produce identical states for all five qubits. The value of the error can vary from one qubit to another, such that the expression $\epsilon^n$ can be interpreted as a product of n complex numbers each of order $\epsilon$. The two terms with quantum number zero for all five ancillary qubits are $|000000\rangle$ and $\epsilon^5|100000\rangle$, and thus when the measurements are performed, the qubit state will be projected into $|0\rangle+\epsilon^5|1\rangle$ with probability on the order of $1-6|\epsilon|^2$. Thus if the outcome of all five measurements is zero, the error in the initialization is reduced by a factor $\epsilon^4$. However, if any measurement outcome is non-zero, the process must be repeated.

Figure 5:
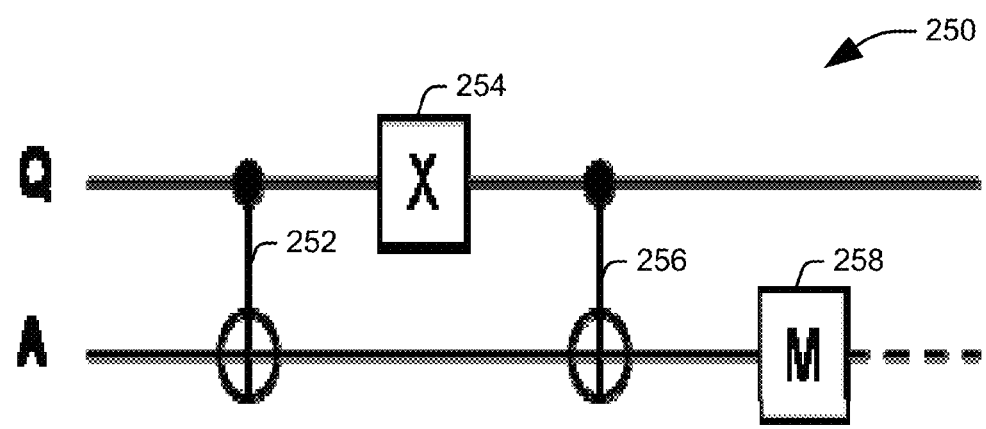
FIG. 5 illustrates a first quantum circuit that can be used to improve the fidelity of an X gate in accordance with an aspect of the present invention.

FIG. 5 illustrates a first quantum circuit 250 that can be used to improve the fidelity of an X gate in accordance with an aspect of the present invention. In the illustrated circuit, a quantum bit of interest, Q, is in an arbitrary state $\alpha|0\rangle+\beta|1\rangle$ while an ancillary qubit, A, is in the ground state. A first CNOT gate operation 252 is then performed on the ancillary qubit, with the quantum bit of interest being used as a control, entangling the states of the two qubits and transitioning the system to a state $\alpha|00\rangle+\beta|11\rangle$. It will be appreciated that the above assumes that the CNOT gate operation is of sufficiently high fidelity that the likelihood of error can be ignored.

After the entangled state has been created, the X gate operation 254 is performed on the quantum bit of interest, Q. If the X gate operation 254 has some small probability of failure $|\epsilon|^2$, after the X gate the system will be in the state $\alpha|10\rangle+\beta|01\rangle+\alpha\epsilon|00\rangle+\beta\epsilon|11\rangle$. A second CNOT gate operation 256 is performed on the ancillary qubit, with the quantum bit of interest being used as a control. The second CNOT gate operation 256 transforms the state of the system to $\alpha|11\rangle+\beta|01\rangle+\alpha\epsilon|00\rangle+\beta\epsilon|10\rangle$. It will be appreciated that after the second CNOT gate operation 256, the ancillary qubit is in an excited state in the two states representing a successful X gate operation, and the ancillary qubit is in its ground state in the two states representing a failed X gate operation. Accordingly, a measurement 258 of the ancillary qubit can be performed. Measurement of the ancillary qubit will yield a ground state with probability $|\epsilon|^2$, and an excited state with probability $1-|\epsilon|^2$. Where the ancillary qubit is the excited state, it is determined that the X gate will have been performed perfectly, up to the fidelity of the CNOT gates 252 and 256 and the measurement 258. If the ancillary qubit is measured in the ground state, the quantum bit of interest will be returned to its original state, and the process is repeated.

Figure 6:
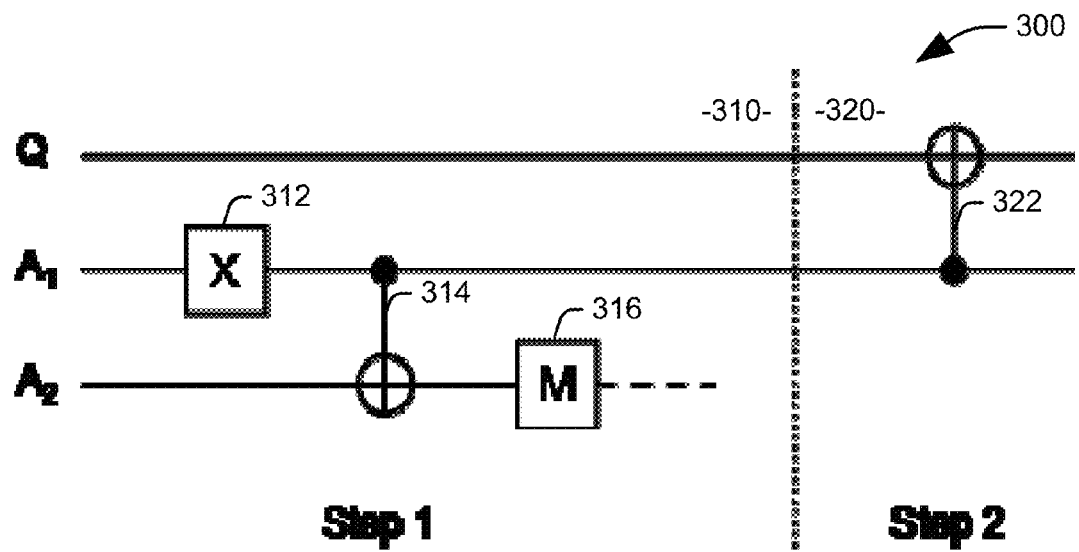
FIG. 6 shows a second quantum circuit that can be used to improve the fidelity of an X gate in accordance with an aspect of the present invention.

FIG. 6 shows a second quantum circuit 300 that can be used to improve the fidelity of an X gate in accordance with an aspect of the present invention. In the illustrated circuit, a quantum bit of interest, Q, is in an arbitrary state $\alpha|0\rangle+\beta|1\rangle$ while two ancillary qubits, $A_1$ and $A_2$ are prepared in the ground state. The circuit is broken into two stages: a first stage 310, labeled step 1, and a second stage 320, labeled step 2. In the first stage 310, the low fidelity X gate operation 312 is performed on the first ancillary qubit, $A_1$, transforming it to the state $\epsilon|0\rangle+|1\rangle$, where $|\epsilon|^2$ is a probability of failure of the low fidelity gate operation 312. A CNOT gate operation 314 is then performed on the second ancillary qubit, $A_2$, using the first ancillary qubit as a control. The CNOT gate operation transforms the state of the system comprising two ancillary qubits from $(\epsilon|0\rangle+|1\rangle)|0\rangle$ to $\epsilon|00\rangle+|11\rangle$. Finally, a measurement 316 of the second ancillary qubit is performed, resulting in a ground state with probability $|\epsilon|^2$ and an excited state with probability $1-|\epsilon|^2$.

If the second ancillary qubit is found to be in the ground state, the X gate is determined to be unsuccessful and the first stage is repeated. If the second ancillary qubit is in the excited state, it is determined that the first ancillary qubit has been successfully prepared in the excited state. In the second stage 320, a CNOT gate operation 322 is performed on the quantum bit of interest, Q, using the first ancillary qubit as the control. Since the CNOT gate operation 322 is high fidelity, and the first ancillary qubit is known to be in the excited state, the CNOT gate operation should invert the state of the quantum bit of interest to a new state, $\beta|0\rangle+\alpha|1\rangle$. To ensure that the X gate was successful, the first ancillary qubit can be measured as well, with a measured excited state indicating a successful operation and a measured ground state indicating that qubit Q is unaltered from its original state.

The quantum circuits shown in FIGS. 5 and 6 are probabilistic, such that some fraction of the circuit will need to be repeated multiple times to produce the desired outcome. The average number of times the circuit will need to be repeated can be determined as $(1-|\epsilon|^2)^{-1}$, which will usually be close to one. For example, if the X gate had only a fifty percent chance of operating correctly, the average number of repetitions is only two. Each of FIGS. 5 and 6 provide advantages, with the first circuit using fewer qubits, and the second circuit allowing the first stage 310 to be performed in advance and the first ancillary qubit maintained in an excited state until needed.

Figure 7:
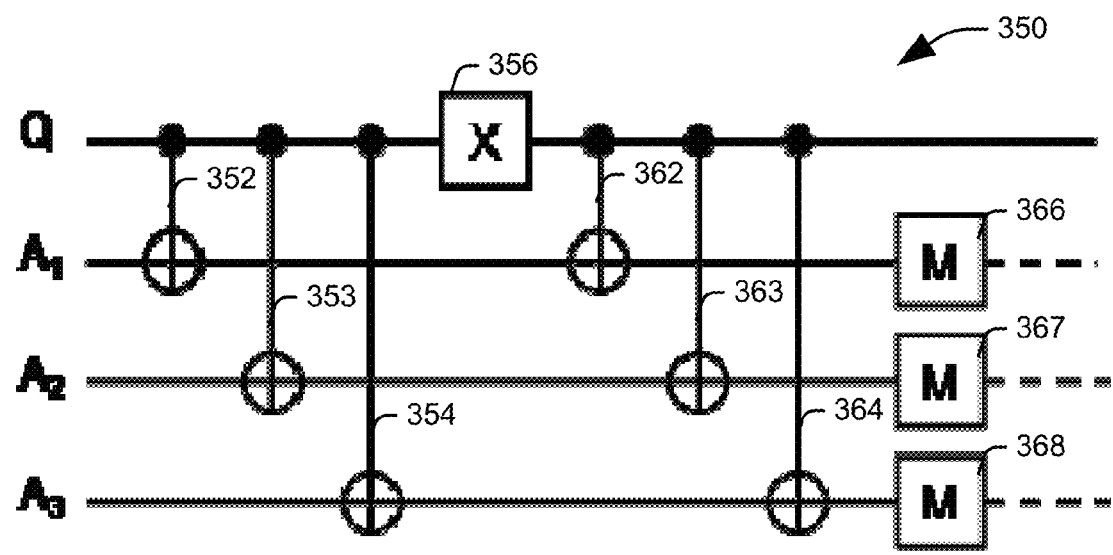
FIG. 7 shows a third quantum circuit that can be used to improve the fidelity of an X gate in accordance with an aspect of the present invention.

FIG. 7 shows a third quantum circuit 350 that can be used to improve the fidelity of an X gate in accordance with an aspect of the present invention. In FIG. 7, the circuits of FIGS. 4 and 5 have been combined as to produce a circuit capable of performing a high fidelity X gate given a high fidelity controlled gate and low fidelity X gates and measurement. In the illustrated implementation, the controlled gate is a CNOT gate, but it will be appreciated that another controlled gate, such as a Toffoli gate or a Fredkin gate, can be used. In this circuit, a quantum bit of interest, Q, is the qubit to be inverted, and a plurality of ancillary qubits, $A_1 \ldots A_3$, are initially prepared in the ground state. The initial state of the system is thus $(\alpha|0\rangle+\beta|1\rangle)|000\rangle$.

A first plurality of CNOT gate operations 352-354 are performed using the quantum bit of interest as a control and the ancillary qubits as targets. This transitions the state of the system to $\alpha|0000\rangle+\beta|1111\rangle$. The low fidelity X gate 356 is performed on the quantum bit of interest, transforming the system to the state $\alpha|1000\rangle+\beta|0111\rangle+\alpha\epsilon|0000\rangle+\beta\epsilon|1111\rangle$, where $|\epsilon^2|$ is an error rate of the X gate. A second plurality of CNOT gate operations 362-364 are then performed using the quantum bit of interest as a control and the ancillary qubits as targets, resulting in the state $\alpha|1111\rangle+\beta|0111\rangle+\alpha\epsilon|0000\rangle+\beta\epsilon|1000\rangle$. Measurements 366-368 are then performed on the ancillary qubits. When the first measurement is performed, the system will be projected into the state $(\alpha|1\rangle+\beta|0\rangle)|111\rangle$ with probability $1-|\epsilon|^2$, and the state $(\alpha|0\rangle+\beta|1\rangle)|000\rangle$ with probability $|\epsilon|^2$.

If each measurement has an error rate $\delta$, then the probability of all three measurements 366-368 reporting correctly is $(1-\delta)^3$. The probability of two or more measurements reporting incorrectly is on the order of $\delta^2$. Accordingly, it is determined which value of the ancillary qubits is obtained in the majority of the measurements, and the effectiveness of the X gate operation is determined from the majority value. If a majority of the ancillary qubits are determined to be in the excited state, the X gate is determined to be successful. If a majority of the ancillary qubits are determined to be in a ground state, the circuit must be repeated. The fact that the circuit may need to be repeated multiple times makes calculation of the probability of success/failure complicated, but the probability that the circuit will fail will be on the order of $\sqrt{\delta^n}$, where n is the number of ancillary qubits used. On average, the circuit will be repeated $(1-|\epsilon|^2)^{-1}$ times.

Figure 8:
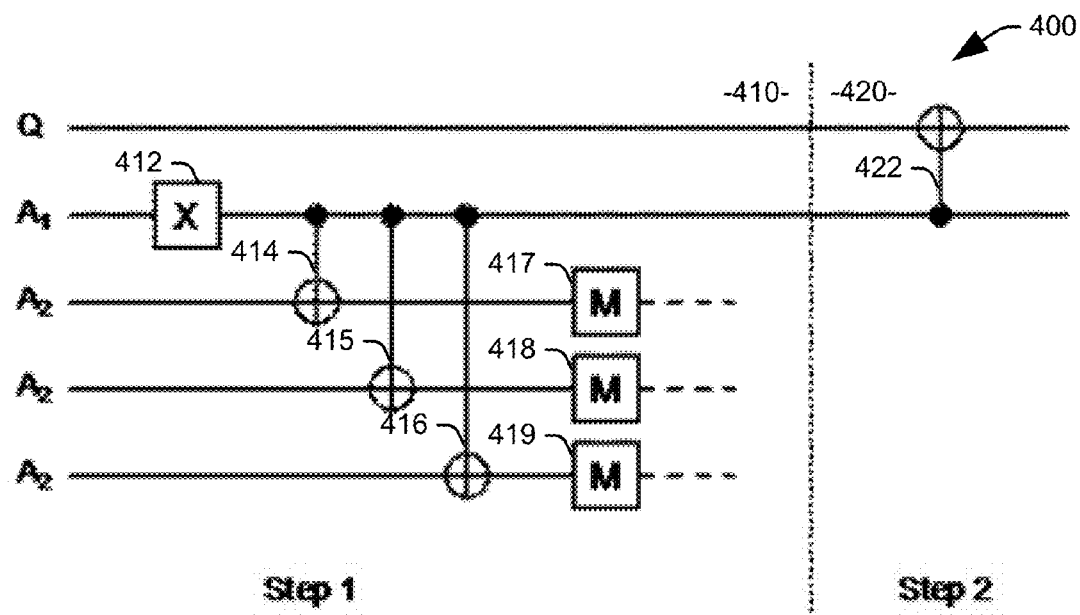
FIG. 8 shows a fourth quantum circuit that can be used to improve the fidelity of an X gate in accordance with an aspect of the present invention.

FIG. 8 illustrates a fourth quantum circuit 400 that can be used to improve the fidelity of an X gate in accordance with an aspect of the present invention. In FIG. 8, the circuits of FIGS. 4 and 6 have been combined as to produce a circuit capable of performing a high fidelity X gate given a high fidelity controlled gate and low fidelity X gates and measurement. In the illustrated implementation, the controlled gate is a CNOT gate, but it will be appreciated that another controlled gate, such as a Toffoli gate or a Fredkin gate, can be used. In this circuit, a quantum bit of interest, Q, is the qubit to be inverted, and a plurality of ancillary qubits, $A_1 \ldots A_4$, are initially prepared in the ground state. The initial state of the system is thus $(\alpha|0\rangle+\beta|1\rangle)|0000\rangle$.

The circuit is broken into two stages: a first stage 410, labeled step 1, and a second stage 420, labeled step 2. In the first stage 410, the low fidelity X gate operation 412 is performed on the first ancillary qubit, $A_1$, transforming it to the state $\epsilon|0\rangle+|1\rangle$, where $|\epsilon|^2$ is a probability of failure of the low fidelity gate operation 412. A plurality of CNOT gate operations 414-416 are then performed using the first ancillary qubit, $A_1$, as a control and the second, third, and fourth ancillary qubits as targets. This transitions the state of the system comprising the ancillary qubits to $\epsilon|0000\rangle+|1111\rangle$. Measurements 417-419 are then performed on the second, third, and fourth ancillary qubits. When the measurement 417 on the second ancillary qubit is performed, the system comprising the ancillary qubits will be projected into the state $|1111\rangle$ with probability $1-|\epsilon|^2$, and the state $|0000\rangle$ with probability $|\epsilon|^2$.

If each measurement has an error rate $\delta$, then the probability of all three measurements 417-419 reporting correctly is $(1-\delta)^3$. The probability of two or more measurements reporting incorrectly is on the order of $\delta^2$. Accordingly, it is determined which value of the ancillary qubits is obtained in the majority of the measurements, and the effectiveness of the X gate operation is determined from the majority value. If a majority of the ancillary qubits are determined to be in a ground state, the first stage 410 must be repeated. If a majority of the ancillary qubits are determined to be in the excited state, the X gate is determined to be successful, and the first ancillary qubit is determined to be in an excited state, and the second stage 420 of the quantum circuit is initiated. In the second stage 420, a CNOT gate operation 422 is performed on the quantum bit of interest, Q, using the first ancillary qubit as the control. Since the CNOT gate operation 422 is high fidelity, and the first ancillary qubit is in the excited state, the CNOT gate operation should invert the state of the quantum bit of interest to a new state, $\beta|0\rangle+\alpha|1\rangle$. To ensure that the X gate was successful, the first ancillary qubit can be measured as well, with a measured excited state indicating a successful operation and a measured ground state indicating that qubit Q is unaltered from its original state.

Figure 9:
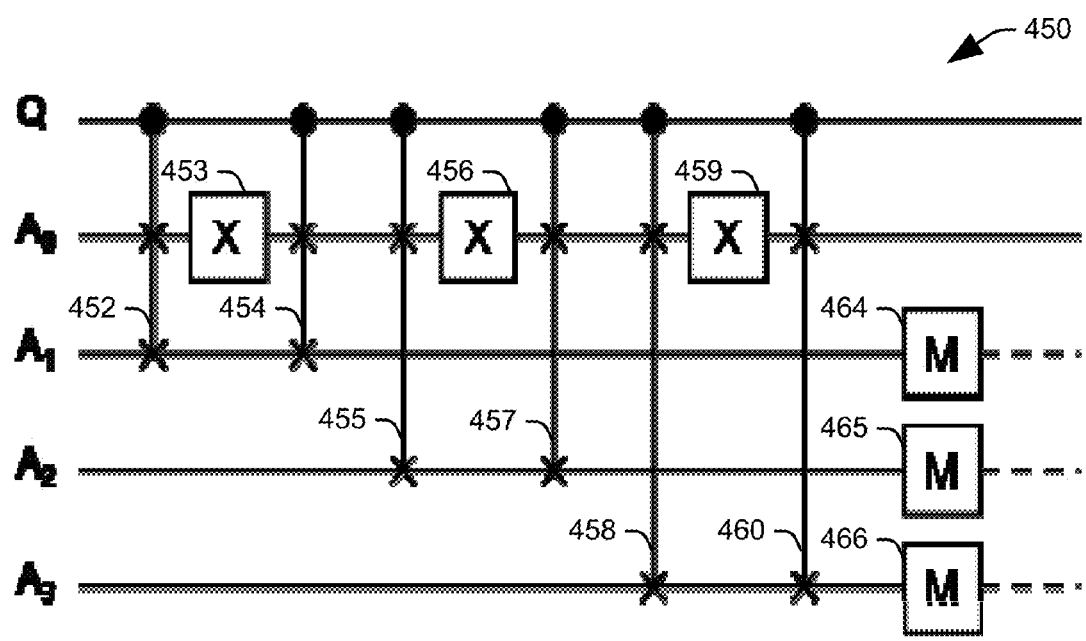
FIG. 9 illustrates another implementation of a schematic quantum gate diagram that employs a high fidelity gate operation to improve a low fidelity measurement in accordance with an aspect of the invention.

FIG. 9 illustrates another implementation of a schematic quantum gate diagram that employs a high fidelity gate operation to improve a low fidelity measurement in accordance with an aspect of the invention. In the schematic quantum gate diagram, a quantum bit of interest, Q, is used as a control qubit in a plurality of high fidelity gate operations 452, 454, 455, 457, 458, 460 on a corresponding set of at least one ancillary qubit. In the illustrated implementation, the high fidelity gate operation is a Fredkin gate operation. Further, a plurality of X gates 453, 456, 459 are performed on a first ancillary qubit, $A_0$, that is a target of each of the Fredkin operations. A gate operations 452-460 are ordered such that, when a first ancillary qubit, $A_0$, is prepared in the $|0\rangle+|1\rangle$ state, the combination of two Fredkin gates (e.g., 452 and 454) between the first ancillary qubit, $A_0$, and one of the ancillary qubits to be measured and the X gate (e.g., 453) on first ancillary qubit, $A_0$, simulate a CNOT gate between the quantum bit of interest and the qubit to be measured.

The result of a set of gate operations is an entanglement of the quantum bit of interest, Q, with at one of the ancillary qubits, $A_1 \ldots A_3$. In the illustrated implementation, the quantum bit of interest is entangled with each ancillary qubit other than the first ancillary qubit. Once the entangled state has been created, each of the entangled ancilla qubits is measured using a corresponding low fidelity measurement 464-466, a majority vote can be performed to determine the correct result. By accepting the majority result from the plurality of measurements 464-466, it is possible to provide an increasingly small error rate, down to an error rate of the high fidelity gate operation, by increasing the number of ancillary qubits.

Figure 10:
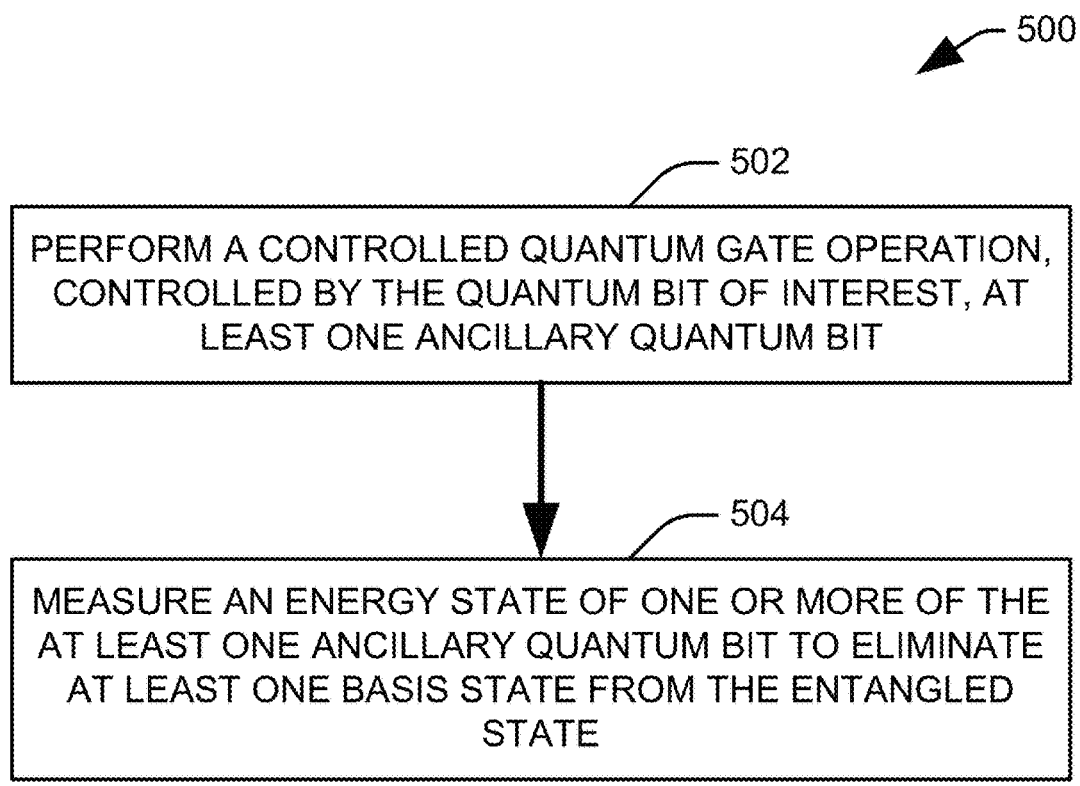
FIG. 10 illustrates a method for improving the fidelity of a quantum operation in accordance with an aspect of the present invention.

FIG. 10 illustrates a method 500 for improving the fidelity of a quantum operation in accordance with an aspect of the present invention. At 502, a controlled quantum gate operation, controlled by the quantum bit of interest, is performed on at least one ancillary quantum bit. It will be appreciated that after a controlled gate operation, the respective states of the ancillary bits are directly dependent on the state of the bit of interest, such that the controlled quantum gate operation produces an entangled state of the system formed by quantum bit of interest and the at least one ancillary quantum bit. The entangled state comprising a superposition of a plurality of basis states.

At 504, an energy state of one or more of the at least one ancillary quantum bit is measured to eliminate at least one basis state from the entangled state. Essentially, the wavefunction of the system formed by quantum bit of interest and the at least one ancillary quantum bit such that the amplitude of at least one basis state of the wavefunction is reduced to zero. By selectively ordering the quantum operation, the controlled quantum gate operation of 502, and the measurement of 504, it is possible to improve the fidelity of another gate operation, such as an X-gate, a measurement, or an initialization of a qubit to an excited state for other logical operations.

The invention has been disclosed illustratively. Accordingly, the terminology employed throughout the disclosure should be read in an exemplary rather than a limiting manner. Although minor modifications of the invention will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

Having described the invention we claim:

1. A method for improving fidelity of a quantum operation on a quantum bit of interest, comprising:
   performing, using physical qubit assemblies and a corresponding control, a controlled quantum gate operation, controlled by the quantum bit of interest, on an ancillary quantum bit to produce an entangled state of the system formed by quantum bit of interest and the ancillary quantum bit, the entangled state comprising a superposition of a plurality of basis states; and
   measuring an energy state of the ancillary quantum bit to eliminate at least one basis state from the entangled state, wherein the controlled quantum gate operation is a Fredkin gate operation.

2. The method of claim 1, the quantum operation comprising a measurement of the quantum bit of interest.

3. The method of claim 1, the controlled quantum gate operation comprising a first controlled quantum gate operation and the quantum bit of interest comprising a first quantum bit of interest, and the method further comprising performing a second controlled quantum gate operation, controlled by the first quantum bit of interest, on a second quantum bit of interest, as to provide an X-gate on the second quantum bit of interest.

4. A method for improving fidelity of a quantum X-gate operation on a quantum bit of interest, comprising:
   performing, using physical qubit assemblies and a corresponding control, the X-gate operation on a first ancillary qubit in a ground state;
   performing a first controlled quantum gate operation, controlled by the first ancillary qubit, on a second ancillary quantum bit in a ground state to produce an entangled state of the system formed by first and second ancillary quantum bits, the entangled state comprising a superposition of a plurality of basis states;

measuring an energy state of the second ancillary quantum bit to eliminate at least one basis state from the entangled state; and performing a second controlled quantum gate operation, controlled by the first ancillary qubit, on the quantum bit of interest if the second ancillary quantum bit was measured in a ground state, such that the state of the quantum bit of interest is changed in a manner consistent with an X-gate operation.

5. A method for improving fidelity of a quantum X-gate operation on a quantum bit of interest, comprising:

performing, using physical qubit assemblies and a corresponding control, a first controlled-NOT operation, controlled by the quantum bit of interest, on an ancillary quantum bit to p to entangle the quantum bit of interest with the ancillary quantum bit to provide a state $\alpha|00\rangle + \beta|11\rangle$, where a is an amplitude of the first state, and $\beta$ is an amplitude of the second state;

performing the X-gate operation on the quantum bit of interest to transform the state of the system to $\alpha(1-\epsilon)|10\rangle + \beta(1-\epsilon)|01\rangle + \alpha\epsilon|00\rangle + \beta\epsilon|11\rangle$, where $\epsilon$ is an error metric of the X-gate operation;

performing a second controlled-NOT operation, controlled by the quantum bit of interest, on the ancillary quantum bit to provide a state $\alpha(1-\epsilon)|11\rangle + \beta(1-\epsilon)|01\rangle + \alpha\epsilon|00\rangle + \beta\epsilon|10\rangle$; and measuring an energy state of the ancillary quantum bit to eliminate at least one basis state from the entangled state, such that the system is in a state $\alpha|11\rangle + \beta|01\rangle$ if the ancillary quantum bit is in the excited state, and in a state $\alpha|00\rangle + \beta|10\rangle$ of the ancillary quantum bit is in the ground state.

6. The method of claim 5, further comprising: accepting the X-gate operation if the ancillary quantum bit is in an excited state.

* * * * *

UNITED STATES PATENT AND TRADEMARK OFFICE
CERTIFICATE OF CORRECTION

PATENT NO.        : 9,208,446 B2
APPLICATION NO.   : 14/140996
DATED             : December 8, 2015
INVENTOR(S)       : Aaron A. Pesetski et al.

Page 1 of 1

It is certified that error appears in the above-identified patent and that said Letters Patent is hereby corrected as shown below:

In the claims

Column 11, claim 5, line 19 reads, "where a is an amplitude of the first state," should read --where α is an amplitude of the first state,--

Column 11, claim 5, line 20 reads, "and βis an amplitude of the second state;" should read --and β is an amplitude of the second state;--

Signed and Sealed this
Sixteenth Day of February, 2016

Michelle K. Lee
*Director of the United States Patent and Trademark Office*